United States Patent

Kang

Patent Number: 5,847,424
Date of Patent: Dec. 8, 1998

[54] CAPACITOR OF SEMICONDUCTOR MEMORY DEVICE AND MANUFACTURING METHOD THEREOF

[75] Inventor: Ho-kyu Kang, Seoul, Rep. of Korea

[73] Assignee: Samsung Electronics Co., Ltd., Kyungki-do, Rep. of Korea

[21] Appl. No.: 589,712

[22] Filed: Jan. 24, 1996

[30] Foreign Application Priority Data

Feb. 17, 1995 [KR] Rep. of Korea ............... 1995-3024

[51] Int. Cl.⁶ .................................................. H01L 27/108
[52] U.S. Cl. ........................................... 257/306; 257/310
[58] Field of Search .................... 257/306, 307–310; 438/254

[56] References Cited

U.S. PATENT DOCUMENTS

| | | | |
|---|---|---|---|
| 5,459,345 | 10/1995 | Okudaira et al. | 257/310 |
| 5,497,016 | 3/1996 | Koh | 257/306 |
| 5,559,666 | 9/1996 | Figura et al. | 257/306 |
| 5,567,964 | 10/1996 | Kashihara et al. | 257/306 |

*Primary Examiner*—Sara W. Crane
*Attorney, Agent, or Firm*—Cushman Darby&Cushman IP Group of Pillsbury Madison & Sutro LLP

[57] ABSTRACT

A capacitor structure of a DRAM device and a method thereof, including a first electrode formed in each unit memory cell to be connected to a source of a transistor, a deteriorating prevention film formed at the lowermost surface of the first electrode, exclusive of a portion where the first electrode is connected to the source of a transistor, an underlayer formed beneath the deterioration prevention film, an undercut formed between the underlayer and deterioration prevention film, a high-dielectric film formed on surfaces of the first electrode, underlayer and deterioration prevention film which is exposed by the undercut, a reaction/diffusion prevention film formed on the high-dielectric film, formed on the first electrode and underlayer, exclusive of an area around the undercut, and a second electrode formed on the entire surface of the high-dielectric film and reaction/diffusion prevention film, thereby preventing increase of leakage current amount caused by the undercut formed during the capacitor manufacturing process.

5 Claims, 6 Drawing Sheets

CAPACITOR OF SEMICONDUCTOR MEMORY DEVICE AND MANUFACTURING METHOD THEREOF

BACKGROUND OF THE INVENTION

The present invention relates to a semiconductor memory device and a manufacturing method thereof, and more particularly, to a capacitor of a semiconductor memory device for reducing leakage current in the capacitor and a manufacturing method thereof.

As semiconductor manufacturing technology advances and applied fields of memory devices expands, memory devices with large capacitance have been developed. DRAMs; (dynamic random access memories), in which a unit memory cell consists of a capacitor and a transistor, have been typical of the development of highly integrated memory devices. Such semiconductor memory devices should have large capacitance to read out and store information. However, when the degree of integration is quadrupled, chip size area increases only 1.4 times and consequently the memory cell is relatively reduced by ⅓ in size. This limited area prevents a conventional capacitor structure from securing proper cell capacitance.

Three methods for obtaining larger capacitance in a small area of a capacitor have been researched: decreasing the thickness of the dielectric film, increasing the effective area of the capacitor, and using a material with a high dielectric constant as the dielectric.

So far, oxide films, ONOs (oxide/nitride/oxide) or NO (nitride/oxide) have been employed as dielectric films of capacitors in memory devices. The dielectric constants of those materials, however, are relatively so low (about 3.8 for oxide film; about 7.8 for nitride film) that they cause problems when used in the next generation of DRAMs. One problem is that the structure of the capacitor becomes too complicated (methods for forming the capacitor in a three-dimensional structure are being searched to increase capacitance). Another problem is that the thickness of the dielectric film gets thin to a limit affecting reliability of the capacitor. Thus, methods of forming the dielectric film of a capacitor using high permittivity dielectric or ferrodielectric materials are being studied to solve the problems.

Among high permittivity dielectric materials, $Ta_2O_5$ (tantalum oxide has) come into the spotlight due to its superior dielectric constant and step-coverage. The electrical property of $Ta_2O_5$ as a dielectric film of an electrode depends heavily on the electrode material of the capacitor. Polycrystalline silicon is used as a material of a lower electrode, and a material made of deposited polycrystalline silicon and TiN (titanium nitride), WN (tungsten nitride), or $WSi_x$ (tungsten silicide) is used as an upper electrode.

When polycrystalline silicon and TiN or the others are used for the lower and upper electrodes, the TiN or others electrode improves the electrical property of the $Ta_2O_5$ electrode film more than a polycrystalline-silicon electrode. However, it has a drawback in that the capacitor deteriorates in a BPSG (boro phospho silicate glass) reflow process performed after the formation of $Ta_2O_5$.

Hence, in order to improve the electrical properties of a dielectric film when a dielectric film is formed with a high permittivity dielectric material such as $Ta_2O_5$, a method of forming the upper electrode by coating the surface of the dielectric film with TiN, and then, depositing polycrystalline silicon thereon has been studied.

FIGS. 1A to 1E are sections for explaining a conventional manufacturing method of a capacitor of a semiconductor memory device. In a conventional manufacturing method of a capacitor, a transistor and a bit line (not shown) are formed above a semiconductor substrate 10 using usual methods, and an interlayer insulation layer 16 is formed by coating the whole surface thereof with silicon dioxide. Then, contact hole 1 is formed to allow the source (not shown) of the transistor to make contact with the lower electrode of the capacitor, and polycrystalline silicon 18 is deposited on the whole surface of the resultant structure to completely fill the contact hole, as shown in FIG. 1.

A lower electrode 20 of the capacitor is formed through a general capacitor forming process, as shown in FIG. 1B, and dielectric film 22 is formed by coating the whole surface of the resultant structure including lower electrode 20 with a high permittivity dielectric such as $Ta_2O_5$, as shown in FIG. 1C. Then, reaction prevention film 24 such as TiN is formed on the whole the resultant structure where dielectric film 22 is formed, as shown in FIG. 1D, and upper electrode 26 is formed by depositing again a layer of polycrystalline silicon thereon, as shown in FIG. 1E.

In FIGS. 1A through 1E, reference numerals 12 and 14 denote a field oxide film and a gate electrode, respectively.

During the formation process of lower electrode 20 or thereafter, interlayer insulation layer 16 is wet-processed in a solution containing hydrofluoric acid so that a part of interlayer insulation layer 16 beneath lower electrode 20 is etched, forming an undercut (A) shown in FIG. 1B. Since the formation of the undercut exposes part of the underside surface of lower electrode 20 (see FIG. 1B), dielectric film 22 and reaction prevention film 24 should be able to completely coat the surface of the lower electrode being exposed.

If the formation material of dielectric film 22 and reaction prevention film 24 have good step coverage, the additionally exposed surface area of lower electrode 20 created by the undercut can be used to increase capacitance so that memory properties can be improved. However, if the step coverage of that material is poor, leakage current occurs around the undercut, causing deterioration of the capacitor.

When $Ta_2O_5$ is used as the high permittivity material, use of TiN films for preventing reaction and diffusion is necessary to improve the electrical properties of the $Ta_2O_5$ dielectric film. Since step coverage of TiN films is much lower than the polycrystalline silicon, reaction prevention film 24 formed of TiN does not completely coat the undercut portion in the conventional capacitor manufacturing method, as shown in FIG. 1D. Thus $Ta_2O_5$ dielectric film 22 comes into directs contact with upper electrode 26 (see FIG. 1E).

Reaction prevention film 24 between dielectric film 22 and upper electrode 26 prevents chemical reaction or diffusion between the dielectric film and the upper electrode. The not covered portion undercut by the reaction prevention film 24, in the conventional capacitor manufacturing method, allows the dielectric film to directly contact the upper electrode so that leakage current at this portion is increased.

SUMMARY OF THE INVENTION

To solve the above problems, it is an object of the present invention to provide a capacitor for a semiconductor memory device, with decreased leakage current, when and dielectric film is formed by using a high permittivity dielectric material.

It is another object of the present invention to provide a method for manufacturing the above capacitor.

Accordingly, to achieve the first object, there is provided a capacitor, for a semiconductor memory device, comprising: a first electrode formed in each unit memory cell to be connected to the source of a transistor; a deteriorating prevention film formed at the lowermost surface of the first electrode, exclusive of the portion where the first electrode is connected with the source of a transistor; an underlayer formed beneath the deterioration prevention film; an undercut formed between the underlayer and the deterioration prevention film; a high permittivity film formed on the surfaces of the first electrode, underlayer, and deterioration prevention film, which is exposed by the undercut; a reaction/diffusion prevention film formed on the high permittivity film, on the first electrode and, on the underlayer, exclusive of the area at the undercut; and a second electrode formed on the entire surface of the high permittivity film and reaction/diffusion prevention film.

In a capacitor of a semiconductor memory device according to the present invention, it is preferred that the first and second electrodes are formed of polycrystalline silicon; the deterioration prevention film is formed of a silicon nitride film; the reaction/diffusion prevention film is formed of a titanium nitride film, tungsten nitride film, or tungsten silicide; and the underlayer is formed of silicon dioxide.

To achieve the second object, there is provided a method for manufacturing a capacitor for a semiconductor memory device, comprising the steps of: (a) forming a transistor and a bit line on a semiconductor substrate; (b) forming an underlayer by coating an insulation material on the entire semiconductor substrate where the transistor and bit line are formed; (c) forming a deterioration prevention film on the underlayer; (d) forming a contact hole for exposing the source of the transistor by partially etching the underlayer and deterioration prevention film; (e) forming a first-electrode-forming layer on the entire surface of the semiconductor substrate to fill the contact hole; (f) forming first electrodes, restricted to one unit cell, by partially etching the first-electrode-forming material layer; (g) forming an undercut between the underlayer and the deterioration prevention film in the lower portion of the first electrode by a cleaning process performed during and/or after the formation of the first electrode; (h) forming a high permittivity film on the entire surface of the first electrode, the underlayer and the deterioration prevention film which is exposed by the undercut; (i) depositing a first reaction/diffusion prevention film on the high permittivity dielectric film which is formed on the first electrode and underlayer which is exposed between the first electrodes; and (j) forming a second electrode on the first reaction/diffusion prevention film and the dielectric film.

In a method for manufacturing the capacitor of a semiconductor memory device according to the present invention, it is preferred that the underlayer is formed of a material which is soluble in an etchant containing hydrofluoric acid, the deterioration prevention film is formed of a material which is insoluble in the same etchant and it is further preferred that the underlayer is formed of silicon dioxide, and the deterioration prevention film is formed of silicon nitride film. It is preferred that the first and second electrodes are formed of polycrystalline silicon.

It is preferred that the capacitor manufacturing method according to the present invention further comprises a step of depositing a second reaction/diffusion prevention film on the first electrode after step (f), and further preferred that the reaction/diffusion prevention film is formed of a titanium nitride film, tungsten nitride film, or tungsten silicide.

Therefore, in capacitors for a semiconductor memory device and the manufacturing method thereof, according to the present invention, leakage current at the undercut is deceased by forming, at the bottom of the first electrode, a deterioration prevention film made of a material insoluble to a hydrofluoric acid solution.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1A:
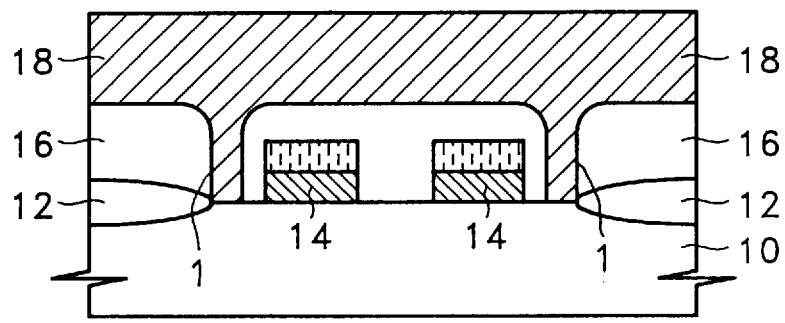
FIGS. 1A–1E are sectional views for explaining a conventional method for manufacturing a capacitor for a semiconductor memory device.
Figure 1B:
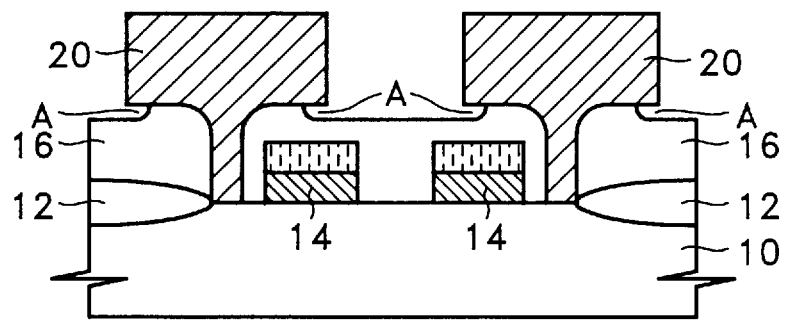
Figure 1C:
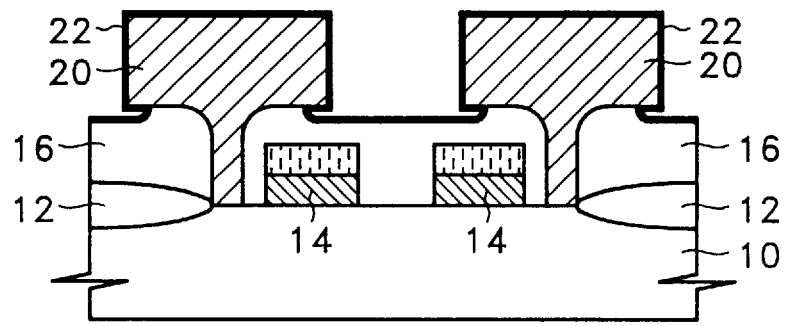
Figure 1D:
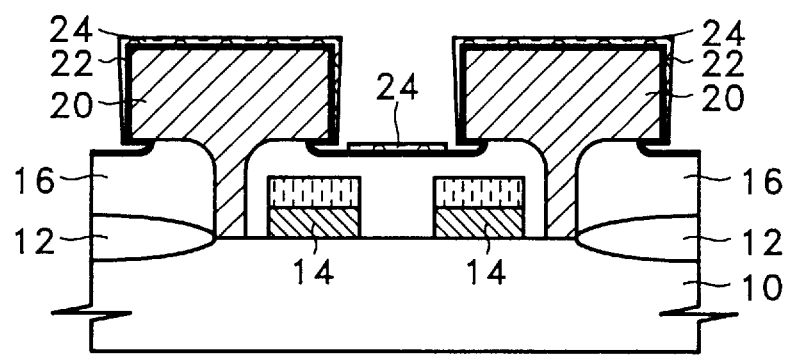
Figure 1E:
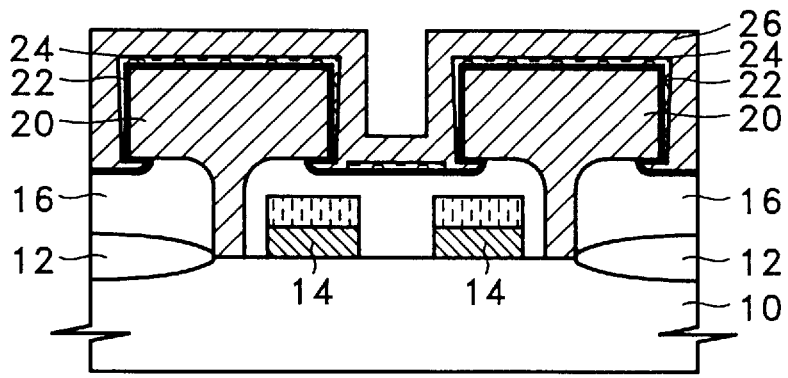
Figure 2:
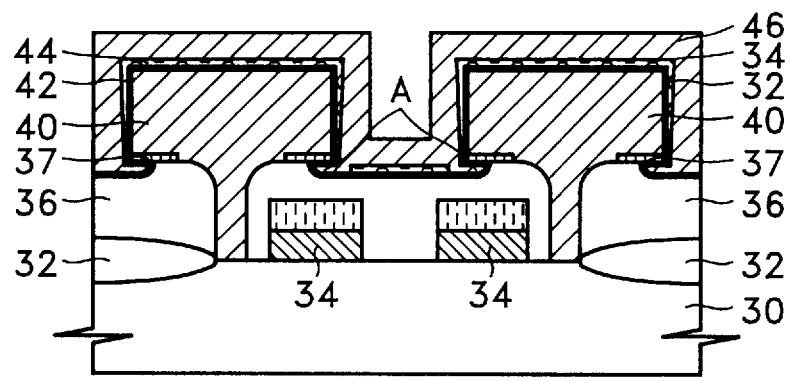
FIG. 2 is a sectional view illustrating the structure of a capacitor for a semiconductor memory device, which is manufactured according to the present invention.

FIG. 2 is a sectional view illustrating the structure of a capacitor for a semiconductor memory device, manufactured according to the present invention.

Reference numeral 30 denotes a semiconductor substrate; reference numeral 32 denotes a field oxide film; reference numeral 34 denotes a gate electrode; reference numeral 36 denotes an underlayer; reference numeral 37 denotes a deterioration prevention film; reference numeral 40 denotes lower electrode; reference numeral 42 denotes a high permittivity dielectric film; reference numeral 44 denotes a reaction/diffusion prevention film; and reference numeral 46 denotes an upper electrode.

Each one of lower electrodes 40 is formed on a unit memory cell to be connected to a source (not shown) of a transistor. Deterioration prevention film 37 is formed between underlayer 36 and lower electrode 40, except for the portion where lower electrode 40 is connected to the transistor source. Underlayer 36 is formed beneath deterioration prevention film 37 and lower electrode 40, and on the transistor.

Undercut A is formed between underlayer 36 and deterioration prevention film 37, and high permittivity dielectric film 42 is formed on a surface of underlayer 36 and lower electrode 40 and deterioration prevention film 37 which is exposed by undercut A. Reaction/diffusion prevention film 44 is formed on the entire surface of high permittivity dielectric film 42 except the portion where undercut A is formed. Upper electrode 46 is formed on the entire surface of high permittivity dielectric film 42 on which reaction/diffusion prevention film 44 is formed.

Here, deterioration prevention film 37 is formed of an insulation material which is insoluble in a solution containing hydrofluoric acid, such as silicon nitride film to prevent the lower electrode around the undercut portion from wrongly acting as a capacitor. Lower electrode 40 and upper electrode 46 are made of polycrystalline silicon, and underlayer 36 and deterioration prevention film 44 are made of silicon dioxide and a titanium nitride film, respectively. It is noted that deterioration prevention film 44 may also be made of a tungsten nitride film or tungsten silicide film instead of the titanium nitride film.

FIGS. 3A through 3E are sections for explaining the manufacturing method of a capacitor, for a semiconductor memory device, according to the present invention.

Figure 3A:
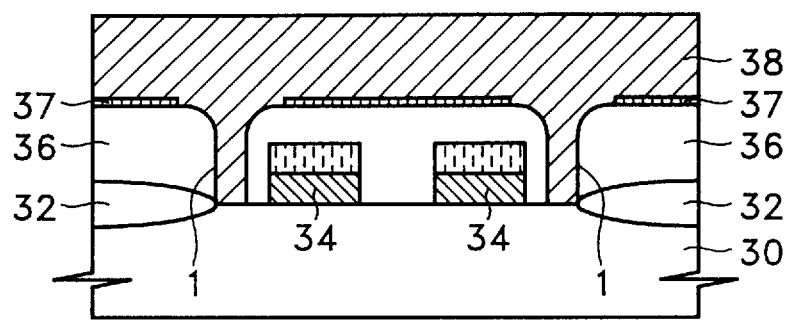
FIGS. 3A–3E are sectional views for explaining the method of manufacturing a capacitor for a semiconductor memory device, according to the present invention.

Primarily, FIG. 3A shows the process of forming deterioration prevention film 37 and conductive material layer 38 for the formation of the lower electrode. The above process comprises: a first step of forming a transistor and a bit line (not shown) on semiconductor substrate 30 by ordinary methods; a second step of forming underlayer 36 by coating an insulation material such as silicon dioxide on the entire surface of the resultant structure; a third step of forming deterioration prevention film 37 on underlayer 36 by coating a material such as silicon nitride film (SiN) having a different etching rate from the material of underlayer 36 in a predetermined etching process; a fourth step of forming contact hole 1 which expose the source (not shown) of a transistor to the surface by partially etching underlayer 36 and deterioration prevention film 37; and a fifth step of forming conductive material layer 38 for the formation of the lower electrode by depositing polycrystalline silicon on the entire surface of the resultant structure where contact hole 1 is formed.

Figure 3B:
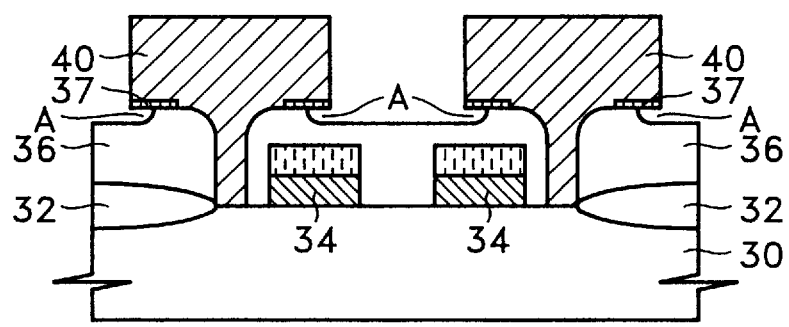

FIG. 3B is a section showing the resultant structure after forming lower electrode 40 by performing an ordinary process for forming the lower electrode. Lower electrode 40 is formed by partially anisotropically etching deterioration prevention film 37 and conductive material layer 38 of FIG. 3A. In doing so, lower electrode 40 is limited in its formation, to a unit of a cell.

In the present invention, though lower electrode 40 is formed in a simple stack, it is apparent that it may be formed in one of various other structures which have already been made public.

Here, in a cleaning process performed during and/or after the formation of the lower electrode, a solution containing hydrofluoric acid is used, and due to the solution, a part of the surface of underlayer 36 suffers damage such that undercut A is formed between underlayer 36 and lower electrode 40. In the present invention, deterioration prevention film 37 formed between lower electrode 40 and underlayer 36 prevents part of the surface of the lower electrode from being exposed at the undercut A portion. Also, in the present invention, a material which is insoluble in a solution containing hydrofluoric acid, such as a silicon nitride film, is used as the material for deterioration prevention film 37.

Figure 3C:
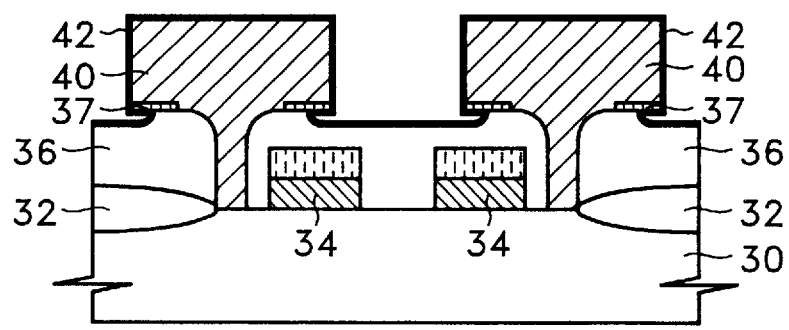

FIG. 3C is useful for explaining the process of forming high-dielectric film 42. In the process, high permittivity dielectric film 42 is formed by coating a dielectric material such as $Ta_2O_5$ on the entire surface of the resultant structure where lower electrode 40 is formed. Here, the reaction/diffusion prevention film (which will be formed later) may be formed prior to coating of high permittivity dielectric film 42 depending on the kinds of dielectric material used as mentioned above. Also, instead of the above-mentioned $Ta_2O_5$, high permittivity dielectric materials, such as $(Ba, Sr)TiO_3$, $BaTiO_3$, $SrTiO_3$, $PbTiO_3$, $Pb(Zr, Ti)O_3$ or $(Pb, La)(Zr, Ti)O_3$, can be used.

Figure 3D:
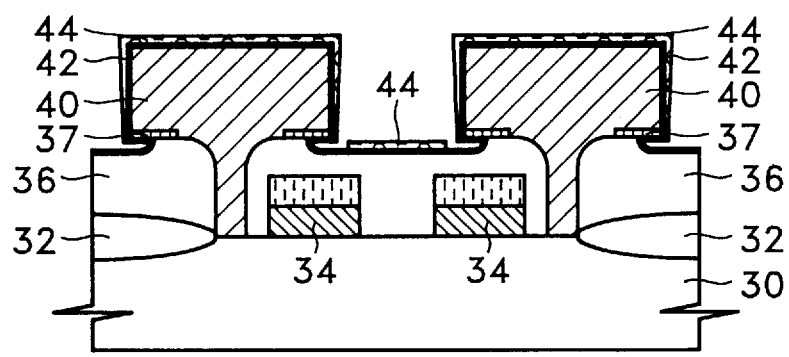

FIG. 3D is useful for explaining the process of forming reaction/diffusion prevention film 44. In the process, reaction/diffusion prevention film 44 is formed by depositing a material, such as a titanium nitride film, for preventing chemical reaction between lower electrode 40 and high permittivity dielectric film 42 on the entire surface of the resultant structure where high permittivity dielectric film 42 is formed. Here, the titanium nitride film usually does not cover the undercut portion due to its inferior step-coverage, as shown in FIG. 3D.

In the case of a capacitor for a semiconductor memory device, according to conventional methods, as the surface of the lower electrode exposed by the undercut is used as an effective area to increase capacitance, leakage current becomes a serious problem, since the reaction/diffusion prevention film does not completely cover the undercut portion. However, in the present invention, since the use of the undercut portion as an effective area for that purpose is prevented by interposing deterioration prevention film 37 between lower electrode 40 and underlayer 36, the leakage current problem occurring at that portion can be avoided, even though reaction/diffusion prevention film 44 does not completely cover the entire surface of the resultant.

Further, besides the titanium nitride film mentioned as a material for forming reaction/diffusion prevention film 44, tungsten nitride or tungsten silicide may be used.

Figure 3E:
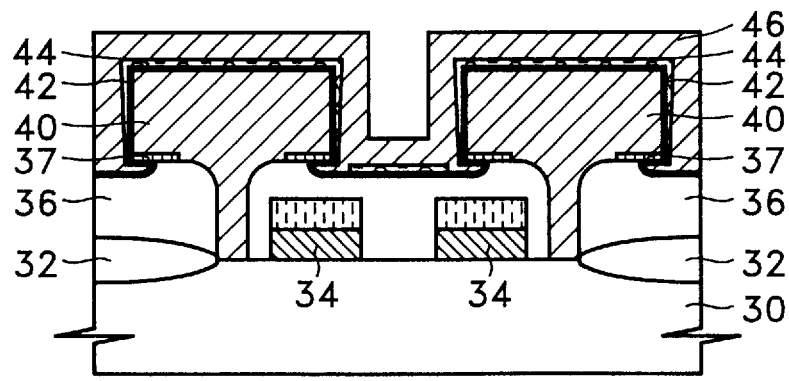

FIG. 3E is a sectional view useful for explaining the process of forming upper electrode 46. In the process, upper electrode 46 is formed by depositing polycrystalline silicon on the entire surface of the resultant structure where reaction/diffusion prevention film 44 is formed.

Figure 4A:
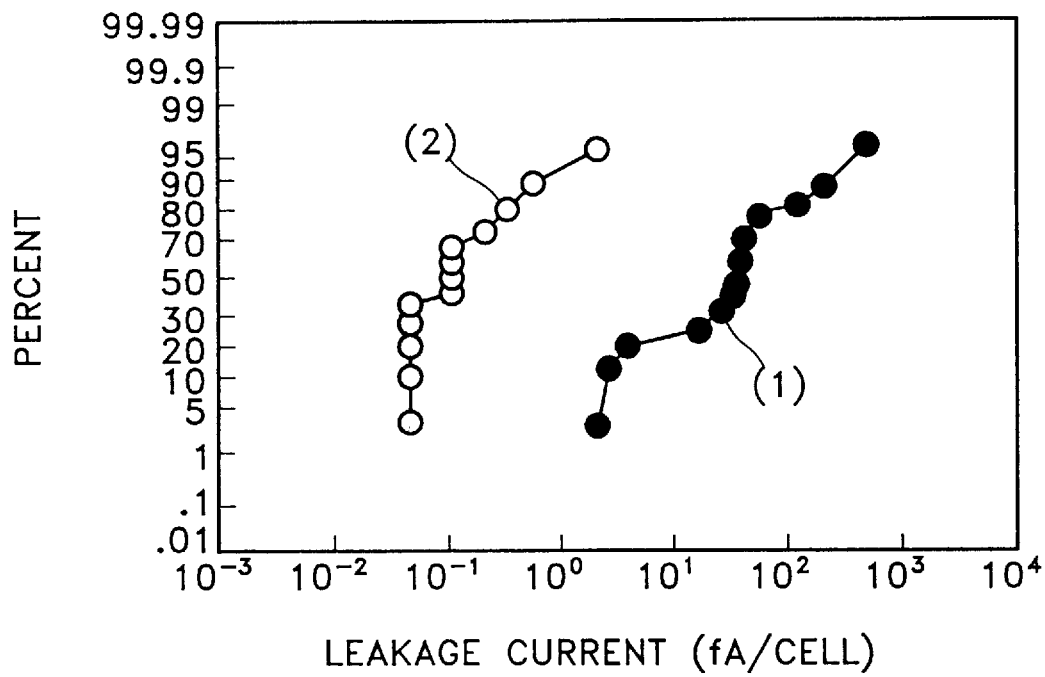
FIG. 4A and 4B are graphs showing the measurement of leakage current of capacitors for semiconductor memory devices, of a conventional device and a device manufactured according to the present inventions, respectively.
Figure 4B:
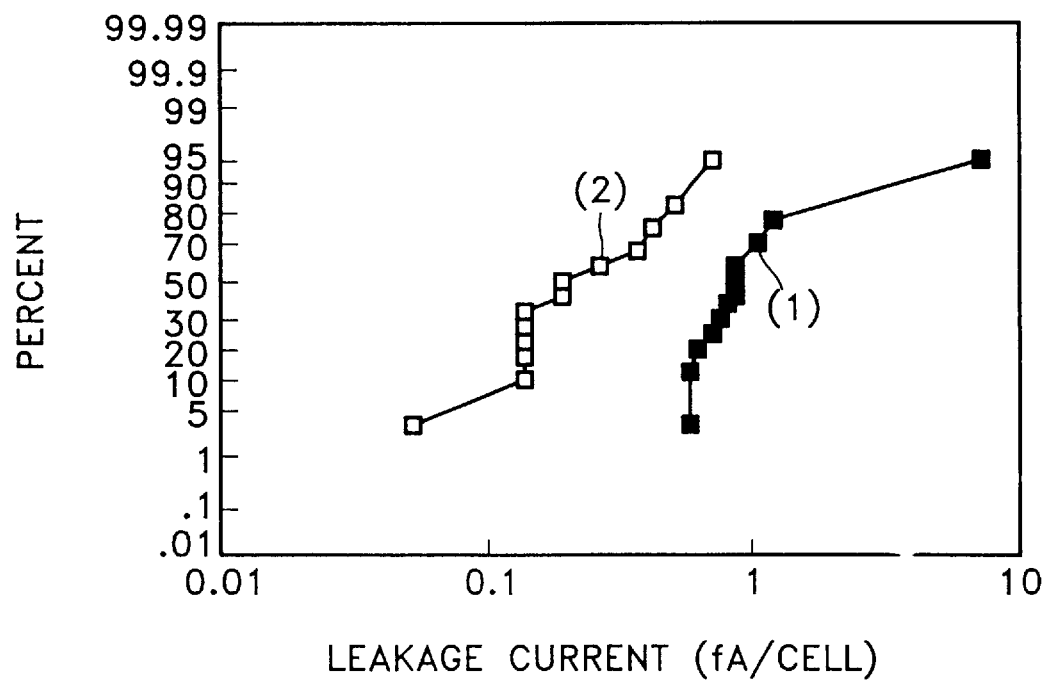

FIGS. 4A and 4B are graphs indicating leakage current the capacitors of the semiconductor memory devices according to conventional methods and the present invention, respectively.

In FIG. 4A, leakage current is measured after forming lower and upper electrodes with polycrystalline silicon and the dielectric film with $Ta_2O_5$: (1) and (2) denote positive and negative currents, respectively. In FIG. 4B, leakage current is measured after forming lower and upper electrodes with polycrystalline silicon, the dielectric film with $Ta_2O_5$ and the reaction/diffusion prevention film with titanium nitride film: (1) and (2) denote positive and negative currents, respectively. As shown, it is noted that the leakage current of the capacitor manufactured according to the method of the present invention is reduced by one tenth that of the conventional invention.

Therefore, according to the capacitor for a semiconductor memory device, of the present invention and a manufacturing method thereof, the increase in leakage current caused by the undercut formed during the capacitor manufacturing process can be prevented.

It is noted that the present invention is not limited to the preferred embodiment described above, and it is apparent that variations and modifications by those skilled in the art can be effected within the spirit and scope of the present invention defined in the appended claims.

What is claimed is:

1. A capacitor for a unit memory cell of a semiconductor memory device, comprising:

a substrate having a transistor formed thereon, said transistor including a source/drain;

an insulator formed on said substrate and said transistor;

a contact hole formed in said insulator to expose the source of said transistor;

a first electrode formed on said insulator and connected to the source of said transistor through said contact hole;

a deterioration prevention film formed on a lower surface of said first electrode and a top surface of said insulator, wherein said deterioration prevention film has a first lower surface portion contacting said top surface of said insulator and a second lower surface portion spaced apart from said top surface of said insulator by an undercut located below said lower surface of the first electrode;

a high permittivity dielectric film formed on surfaces of said first electrode, insulator and deterioration prevention film;

a barrier metal film formed on the high permittivity film on said first electrode; and a second electrode formed on the entire surface of the barrier metal film.

2. A capacitor for a semiconductor memory device, according to claim 1, wherein said first and said second electrodes are formed of polycrystalline silicon.

3. A capacitor for a semiconductor memory device, according to claim 1, wherein said deterioration prevention film is formed of a silicon nitride film.

4. A capacitor for a semiconductor memory device according to claim 1, wherein said barrier metal film is formed of one material selected from the group consisting of titanium nitride, tungsten nitride, and tungsten silicide.

5. A capacitor for a semiconductor memory device, according to claim 1, wherein said insulator is formed of silicon dioxide.

* * * * *